United States Patent
Mesuda et al.

(10) Patent No.: US 9,396,830 B2
(45) Date of Patent: Jul. 19, 2016

(54) ZINC OXIDE SINTERED COMPACT, SPUTTERING TARGET, AND ZINC OXIDE THIN FILM

(75) Inventors: Masami Mesuda, Tokyo (JP); Hideto Kuramochi, Kanagawa (JP); Hitoshi Iigusa, Kanagawa (JP); Kenji Omi, Kanagawa (JP); Tetsuo Shibutami, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 159 days.

(21) Appl. No.: 13/879,506
(22) PCT Filed: Nov. 25, 2011
(86) PCT No.: PCT/JP2011/077232
§ 371 (c)(1), (2), (4) Date: Apr. 15, 2013
(87) PCT Pub. No.: WO2012/077512
PCT Pub. Date: Jun. 14, 2012

(65) Prior Publication Data
US 2013/0214215 A1 Aug. 22, 2013

(30) Foreign Application Priority Data
Dec. 6, 2010 (JP) ................................. 2010-271756

(51) Int. Cl.
*H01B 1/08* (2006.01)
*C04B 35/00* (2006.01)
(Continued)

(52) U.S. Cl.
CPC ................ *H01B 1/08* (2013.01); *C04B 35/453* (2013.01); *C04B 35/645* (2013.01); *C04B 37/026* (2013.01); *C23C 14/086* (2013.01); *C23C 14/3407* (2013.01); *C23C 14/3414* (2013.01); *H01L 21/02554* (2013.01); *H01L 21/02581* (2013.01); *H01L 21/02631* (2013.01);
(Continued)

(58) Field of Classification Search
CPC .................................... H01B 1/00; H01B 1/08
USPC ....................... 252/519.5, 519.51; 204/192.15
See application file for complete search history.

(56) References Cited

U.S. PATENT DOCUMENTS

2002/0121960 A1* 9/2002 Ando et al. ...................... 338/21
2009/0206303 A1* 8/2009 Osada ....................... 252/519.51
(Continued)

FOREIGN PATENT DOCUMENTS

| CN | 1718840 | | 1/2006 |
|---|---|---|---|
| CN | 1718841 A | * | 1/2006 |

(Continued)

OTHER PUBLICATIONS

Hanfa et al "Influence of the sputtering pressure on the properties of transparent conducting zirconium-doped zince oxide films . . . ", Journal of Semiconductors, vol. 30, No. 2, Feb. 2009 pp. 023001-1 to 023001-4.*

(Continued)

*Primary Examiner* — Mark Kopec
(74) *Attorney, Agent, or Firm* — Greenblum & Bernstein, P.L.C.

(57) ABSTRACT

There is provided a zinc oxide sintered compact with a zirconium content of 10 to 1000 ppm, and a sputtering target containing the zinc oxide sintered compact. There is also provided a zinc oxide thin-film having a zirconium content of 10 to 2000 ppm and a resistivity of 10 Ω·cm or greater.

11 Claims, 8 Drawing Sheets

(51) Int. Cl.

| | | |
|---|---|---|
| *C04B 35/453* | (2006.01) | |
| *C04B 35/645* | (2006.01) | |
| *H01L 21/02* | (2006.01) | |
| *C23C 14/34* | (2006.01) | |
| *C04B 37/02* | (2006.01) | |
| *C23C 14/08* | (2006.01) | |

(52) U.S. Cl.
CPC . *C04B2235/3244* (2013.01); *C04B 2235/3246* (2013.01); *C04B 2235/3284* (2013.01); *C04B 2235/404* (2013.01); *C04B 2235/5409* (2013.01); *C04B 2235/5445* (2013.01); *C04B 2235/604* (2013.01); *C04B 2235/608* (2013.01); *C04B 2235/6562* (2013.01); *C04B 2235/6565* (2013.01); *C04B 2235/6586* (2013.01); *C04B 2235/725* (2013.01); *C04B 2235/77* (2013.01); *C04B 2235/786* (2013.01); *C04B 2237/12* (2013.01); *C04B 2237/34* (2013.01); *C04B 2237/407* (2013.01)

(56) References Cited

U.S. PATENT DOCUMENTS

| | | | | |
|---|---|---|---|---|
| 2009/0250669 | A1* | 10/2009 | Osada | 252/519.51 |
| 2014/0001040 | A1* | 1/2014 | Inoue et al. | 204/298.13 |

FOREIGN PATENT DOCUMENTS

| | | | |
|---|---|---|---|
| CN | 101208452 | | 6/2008 |
| JP | 58-500174 | | 2/1983 |
| JP | 2-149459 | | 6/1990 |
| JP | 7-288049 | | 10/1995 |
| JP | 2000-232005 | A | 8/2000 |
| JP | 2002-246621 | | 8/2002 |
| JP | 2005-281862 | A | 10/2005 |
| JP | 2008-115453 | | 5/2008 |
| JP | 2009-167095 | | 7/2009 |
| JP | 2010-150610 | | 7/2010 |
| JP | 2010/202896 | | 9/2010 |
| JP | 2012136417 A * | | 7/2012 |
| TW | I312811 B | | 8/2009 |
| WO | 2007/000878 | | 1/2007 |
| WO | 2007/066490 | | 6/2007 |
| WO | 2009/110092 | | 9/2009 |

OTHER PUBLICATIONS

Tsay et al "Optimization of Zr-doped ZnO thin films . . . ", Materials Transactions, vol. 49, No. 8, (2008) 1900-1904.*

Lee et al "Low-voltage Zn0.97Zr0.03 thin film transistors . . . ", Electrochemical and Solid-State Letters, 9 (9), G292-G295 (2006).*

Lee et al "Chemical Solution Deposition of Zn1-xZrxO thin films . . . ", Electrochemical and Solid-State Letters, 9 (4), G117-G120 (2006).*

International Preliminary Report on Patentability (IPRP) issued in counterpart application PCT/2011/077232, mailed Jun. 20, 2013.

Chinese office action in CN 201180058840.8, mail date is Feb. 8, 2014. (No English translation).

Japanese Office Action issued for application No. 2011-224969, mail date is May 26, 2015, (no English language translation provided).

Taiwanese Office Action issued for application No. 100144658, mail date is Jun. 9, 2015, (no English language translation provided).

* cited by examiner

ZINC OXIDE SINTERED COMPACT, SPUTTERING TARGET, AND ZINC OXIDE THIN FILM

TECHNICAL FIELD

The present invention relates to a zinc oxide sintered compact to be used as a starting material for production of a zinc oxide thin-film by sputtering, to a sputtering target comprising the zinc oxide sintered compact, and to a zinc oxide thin-film. More specifically, the invention relates to a zinc oxide sintered compact with high strength and low resistance, that allows production of a high-resistance zinc oxide thin-film by sputtering, to a sputtering target comprising the zinc oxide sintered compact, and to a zinc oxide thin-film.

BACKGROUND ART

Zinc oxide is a white powder with a hexagonal crystal structure, and in recent years it is being used for a variety of purposes, in the formation of thin-films. The methods used to form such zinc oxide thin-films include physical vapor deposition methods such as vacuum vapor deposition and sputtering, and chemical vapor deposition methods such as CVD. Sputtering methods are widely employed as methods for forming zinc oxide thin-films, because they allow stable film formation even with low-vapor-pressure materials, and the process is simple.

Sputtering is a method in which a positive ion such as argon ion is physically impacted with a target set on a cathode, the impact energy causing the material of the target to be discharged, accumulating a film of approximately the same composition as the target material on a substrate that has been set facing the target. Sputtering methods include direct current sputtering methods (DC sputtering methods), and radio-frequency sputtering methods (RF sputtering methods). Direct current sputtering methods involve using a DC power supply to apply a direct-current voltage to the cathode target, and they have the advantage of high film-forming speed and high productivity. However, direct current sputtering methods are restrictive in that the resistivity of the target used must be no greater than $10^5$ Ω·cm. This is because using a target with a resistivity of $10^5$ Ω·cm or greater results in non-stable discharge being generated during sputtering.

On the other hand, high-frequency sputtering methods employ a high-frequency power source instead of a DC power supply. Although the target used does not have to be a conducting material, the film deposition rate is slower than with a direct current sputtering method, and the productivity tends to be low. Also, because of the complexity and high cost of the power source and apparatus, equipment cost also tends to be high. A demand therefore exists for a target that can be used in direct current sputtering methods.

Zinc oxide thin-films are typically used as transparent conductive films. For example, zinc oxide thin-films containing zirconium added at 0.1 atomic percent (corresponding to 1120 ppm by weight) or greater have been proposed, which are imparted with conductivity by addition of additives, for use as transparent conductive films for solar cells (PTL 1, for example). However, the electric conductivity of such thin-films is 0.0003 Ω·cm, and they cannot be used as high-resistance thin-films.

Other uses of thin-films composed mainly of zinc oxide are for zinc oxide thin-films with high resistance. For example, the use of zinc oxide thin-films with high resistance values of 1.0 Ω·cm or greater as buffer layers in CIGS thin-film solar cells has been proposed (PTL 2, for example). For such purposes, the resistivity of the zinc oxide thin-film is preferably as high as possible.

The zinc oxide targets used to form such zinc oxide thin-films by sputtering are of high purity, containing absolutely minimal additives or impurities (PTL 3, for example). The reason for this is that the presence of impurities in the film generates carrier electrons from the impurities which lower the resistivity of the film, making it impossible to obtain a thin-film with high resistance (PTL 2).

A zinc oxide thin-film having such high resistance can be formed by sputtering using relatively inexpensive starting materials, but two problems arise in this case.

The first problem is that the zinc oxide target used to form such a thin-film has low conductivity and is therefore unsuitable for direct current sputtering methods. A high-purity zinc oxide target has low impurity-driven carrier generation, and therefore has resistivity of $10^7$ Ω·cm or greater. It is therefore unsuitable for direct current sputtering methods. It is therefore necessary to employ high-frequency sputtering methods, which are associated with low film-forming speeds and high equipment cost.

Reactive sputtering is a known strategy for avoiding this problem. The method is one in which argon gas is introduced together with a reactive gas, and the target material discharged by the impact of argon ions reacts with the reactive gas, accumulating as an insulating film on the substrate. It is a feature of the method that it allows formation of insulating films by direct current sputtering using conductive targets. For formation of a high-resistance zinc oxide thin-film, using a conductive metal zinc target and adding oxygen gas to the argon gas for direct current sputtering allows an insulating zinc oxide thin-film to be accumulated. In this method, however, the quality of the zinc oxide thin-film varies significantly depending on the amount of reactive gas added and changes in the zinc deposition rate over time. Control of the reaction is therefore difficult, and it is difficult to obtain a film with stable resistivity.

Another method of forming a zinc oxide thin-film with high resistance has been proposed, in which zinc metal is mixed with zinc oxide powder and firing is conducted at below the melting temperature of zinc (PTL 5). Since the target in this method contains zinc metal, it is possible to lower the resistance. However, since the firing temperature is near the melting point of zinc (419.5° C.), densification of zinc oxide does not progress sufficiently. The target is therefore quite brittle, and the target readily cracks during sputtering.

The second problem in forming a zinc oxide thin-film with high resistance by sputtering is the low strength of the target. Here, "strength" means the physical strength of the target, and the measured value is represented as the transverse intensity. Virtually no impurities are present in a high-purity zinc oxide target. When a target is produced by firing, therefore, there is minimal sintering inhibition by impurities. As a result, although grain growth of the target proceeds, abnormal grain growth also takes place, drastically lowering the strength of the sintered compact. In addition, since the exterior of the sintered compact undergoes sintering and densification before the interior, air bubbles remain in the interior and the density of the sintered compact tends to be reduced. Furthermore, the virtual lack of impurities weakens interaction at the grain boundaries, and cracking, chipping and shedding very frequently take place at the grain boundary sections.

In order to ameliorate this problem, it has been proposed to conduct firing of zinc oxide at a high temperature of 1200° C. so that densification occurs through to the interior of the sintered compact (PTL 3). However, firing at such a high temperature results in accelerated grain growth of the sintered compact and increased particle size. As a result, the transverse intensity of the obtained target is less than 40 MPa and it is extremely brittle. The low transverse intensity of such a target tends to lead to cracking of the target in sputtering methods.

CITATION LIST

Patent Literature

[PTL 1] Japanese Unexamined Patent Application Publication HEI No. 2-149459
[PTL 2] International Patent Publication No. WO2009/110092
[PTL 3] Japanese Unexamined Patent Application Publication No. 2009-167095
[PTL 4] Japanese Patent Public Inspection SHO No. 58-500174
[PTL 5] Japanese Unexamined Patent Application Publication No.

SUMMARY OF INVENTION

Technical Problem

Incidentally, cylindrical sputtering targets have begun to come into use in recent years. Cylindrical sputtering targets generate increased interior stress during sputtering, compared to conventional flat targets. Therefore, even higher strength is considered necessary. For this reason, the cylindrical targets in wide use have conventionally been formed of metal materials. On the other hand, targets formed of ceramic materials, which are of low strength and brittle, tend to exhibit cracking during sputtering and production. At the current time, therefore, almost no targets made of ceramic materials are being used, except for targets in thermal spraying methods. A ceramic target in a thermal spraying method will tend to have air bubbles remaining inside the target, and it will therefore be a low-density target, having a relative density of no greater than 90%. This results in the problem that cracking or anomalous discharge of the target can more easily occur during sputtering.

A rotating cathode sputtering apparatus using a cylindrical target is not suitable for high-frequency sputtering. Demand therefore exists for a cylindrical zinc oxide target having high density and high strength, as well as conductivity to allow formation by direct current sputtering methods.

The present invention has been accomplished in light of these circumstances, and one object thereof is to provide a zinc oxide sintered compact and a sputtering target that can adequately inhibit generation of cracks during production of the sputtering target and during sputtering, and that also have high strength. It is another object of the invention to provide a zinc oxide thin-film having both high resistivity and high transmittance, by using the zinc oxide sintered compact.

Solution to Problem

The present inventors have completed this invention as a result of much diligent research directed toward solving the problems described above. Specifically, the invention is the following.
(1) A zinc oxide sintered compact with a zirconium content of 10 to 1000 ppm.
(2) The zinc oxide sintered compact according to (1), wherein the resistivity is no greater than $10^5$ Ω·cm.
(3) The zinc oxide sintered compact according to (1) or (2), which is cylindrical.
(4) A sputtering target comprising a zinc oxide sintered compact according to any one of (1) to (3).
(5) A zinc oxide thin-film having a zirconium content of 10 to 2000 ppm and a resistivity of 10 Ω·cm or greater.
(6) The zinc oxide thin-film according to (5), wherein the zirconium content is 10 to 1000 ppm.
(7) The zinc oxide thin-film according to (5) or (6), wherein the transmittance at a wavelength of 500 nm is 75% or greater with a film thickness of 100 nm.

Advantageous Effects of Invention

According to the invention, it is possible to increase the strength of a sintered compact (to 40 MPa or greater, for example) by adding zirconium at 10 to 1000 ppm to a zinc oxide sintered compact. This can prevent occurrence of cracking and chipping while bonding during firing, sintered compact machining and target fabrication, which have occurred in the past due to insufficient strength, and can improve productivity. It can also adequately inhibit cracking of the target during sputtering, and allow stable production of a zinc oxide thin-film with both high resistivity and high transmittance.

Moreover, if the resistivity of the zinc oxide sintered compact is no greater than $10^5$ Ω·cm, the sputtering target will be usable for film formation by direct current sputtering.

Furthermore, since the zinc oxide sintered compact has high strength, it allows complex machining into cylindrical shapes and the like. This makes it possible to produce a target for a rotating cathode sputtering apparatus. In addition, this can adequately inhibit cracking of the cylindrical zinc oxide target during sputtering, and allows stable production of a zinc oxide thin-film with both high resistivity and high transmittance.

A zinc oxide thin-film having zirconium added at 10 to 2000 ppm and having high resistivity of 10 Ω·cm or greater can be suitably used as a semiconductor insulating film or solar cell buffer layer.

DESCRIPTION OF EMBODIMENTS

Preferred embodiments of the invention will now be described in detail. Throughout the present specification, "ppm" for zirconium represents the zirconium weight-based content, of the total weight (wt ppm).

<Zinc Oxide Sintered Compact>

Figure 1:
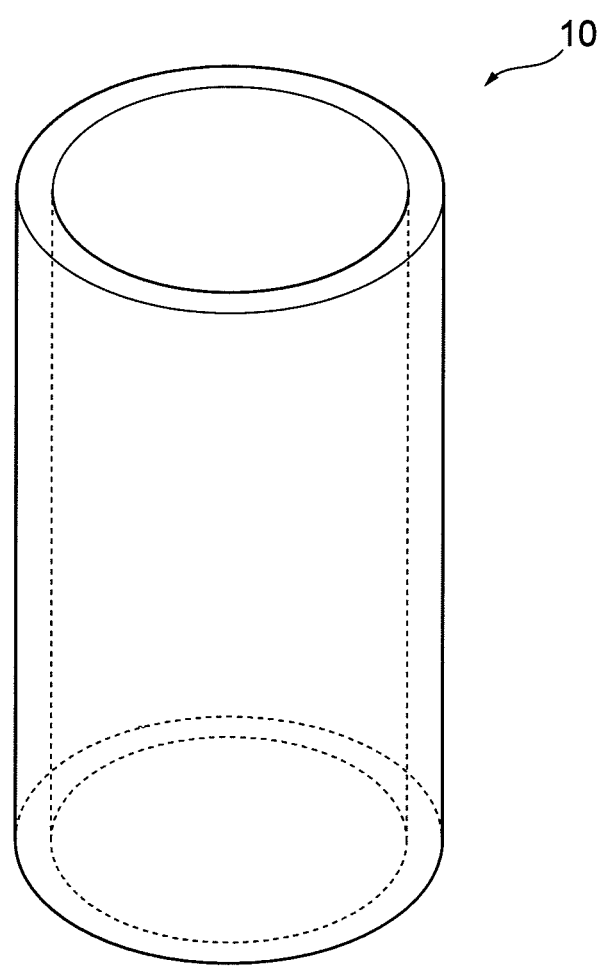
FIG. 1 is a perspective view showing a preferred embodiment of a zinc oxide sintered compact of the invention.

FIG. 1 is a perspective view showing a zinc oxide sintered compact according to this embodiment. The zinc oxide sintered compact 10 of this embodiment is a sintered compact containing zinc oxide as the major component, with zirconium at 10 to 1000 ppm in addition to zinc oxide. The zinc oxide sintered compact (also referred to as "sintered compact") 10 contains zirconium at a content of at least 10 ppm, and the zirconium can thereby be uniformly present inside the particles and at the grain boundaries of the zinc oxide sintered compact 10. This can drastically increase the strength of the zinc oxide sintered compact 10. If the zirconium content is less than 10 ppm, it will be difficult for the zirconium to uniformly diffuse throughout the zinc oxide sintered compact, and it will become difficult to increase the strength of the zinc oxide sintered compact 10.

A greater zirconium content will tend to increase the strength of the zinc oxide sintered compact 10. However, a zirconium content of greater than 1000 ppm will lower the resistivity of a zinc oxide thin-film formed using a sputtering target comprising the sintered compact. The effect of allowing production of a zinc oxide thin-film with high resistance will be reduced as a result. The zirconium content of the zinc oxide sintered compact 10 of this embodiment is therefore between 10 and 1000 ppm.

By adding zirconium within this range, it will be possible to increase the strength of the zinc oxide sintered compact 10 while allowing production of a zinc oxide thin-film with high resistance when the sintered compact is used as a target. From the viewpoint of obtaining a zinc oxide sintered compact with even higher strength, the zirconium content is preferably 30 to 1000 ppm.

The zinc oxide sintered compact 10 of this embodiment thus has high strength. It can therefore be used as a cylindrical zinc oxide-based target. It can also be suitably used as a sputtering target.

The resistivity of the zinc oxide sintered compact 10 of this embodiment is preferably no greater than $10^5$ Ω·cm. Such low resistivity of the zinc oxide sintered compact 10 will allow its use as a sputtering target in a direct current sputtering method. There are no particular restrictions on the method of limiting the resistivity to no greater than $10^5$ Ω·cm. For example, the zirconium content of the zinc oxide sintered compact 10 may be set at 500 ppm or greater, or oxygen defects may be created in the zinc oxide to lower the bulk resistance value. When oxygen defects are present in zinc oxide, carriers are generated and the resistivity of the zinc oxide sintered compact 10 is reduced.

The method for creating oxygen defects is not particularly restricted. For example, the oxygen partial pressure in the atmosphere may be lowered during firing of the zinc oxide sintered compact 10. It will thus be possible to lower the resistivity of the zinc oxide sintered compact 10 to about 1/100 compared to firing in air, even when the zirconium content is less than 500 ppm. When a zinc oxide sintered compact 10 having such oxygen defects is to be used to fabricate a target for film formation by sputtering, oxygen deficiency may be compensated by adding a trace amount of oxygen gas.

The zinc oxide sintered compact 10 containing zirconium may be produced in the following manner, as an example. Specifically, the production method described here has a mixing step in which a powder containing zinc oxide and a zirconium source is prepared, a molding step in which the powder is molded to produce a compact, and a firing step in which the compact is fired. Each step will now be explained in detail.

[Mixing Step]

The zinc oxide powder starting material used is preferably one with as few impurities as possible, in order to minimize lowering the resistivity of the zinc oxide thin-film. The zirconium source that is added is not particularly restricted so long as it contains zirconium, and it may be zirconium metal, a zirconium salt such as zirconium chloride, a zirconium complex, zirconium oxide (zirconia), partially stabilized zirconia, stabilized zirconia, or alumina-added zirconia.

Preferred among these zirconium sources are zirconium oxide, partially stabilized zirconia, stabilized zirconia and alumina-added zirconia, which are oxides like zinc oxide. There are no particular restrictions on the properties of additives. When a powder is used as an additive, it is preferably a fine powder in order to improve dispersibility.

The method for mixing the zinc oxide powder and zirconium source is not particularly restricted. The zinc oxide powder and zirconium source are preferably mixed to as uniform a state as possible. The mixing method may be a method of dry ball mill mixing, wet bead mill mixing or agitated mixing. Methods in which zinc oxide powder mixed with a prescribed amount of a zirconium source is further mixed with zinc oxide powder, for dilution to a prescribed concentration, are also effective as methods for achieving uniform mixing.

A different method for adding and mixing a zirconium source is one in which zirconium oxide is used as the medium for the grinding, mixing or dispersing apparatus. Specifically, this method involves using a container with zirconia beads and/or lined with zirconia as the grinding, mixing and dispersing apparatus, for grinding, mixing and dispersion of zinc oxide in order to mix a trace amount of zirconium with the zinc oxide powder. This method is advantageous in that it prevents the medium for the grinding, mixing and dispersing apparatus from becoming a contaminating source, and the medium serves as a zirconium source.

For example, zinc oxide is prepared as a slurry and dispersed with zirconia beads in a zirconia-lined container. This will allow uniform mixing of zirconium and zinc oxide. Using such a method will allow uniform mixing of a trace amount of zirconium with the zinc oxide. The amount of addition may be adjusted by the mixing time, allowing the zirconium content of the final zinc oxide sintered compact 10 to be controlled to between 10 and 1000 ppm.

The grinding, mixing and dispersing apparatus may be either dry or wet, but it is preferably wet from the viewpoint of obtaining a more uniform dispersed state of the zirconium.

The final state of the powder is not particularly restricted. For molding with a dry system, it is preferred to use a granulated powder so that the powder flow property is high and the compact density is uniform. The granulation method is also not particularly restricted, and may be spraying granulation, fluidized bed granulation, tumbling granulation, agitated granulation or the like. Spraying granulation is preferably employed because the procedure is easy and it allows treatment in bulk.

There are no particular restrictions on the physical properties of the powder. From the viewpoint of obtaining a high-density zinc oxide sintered compact 10, however, the BET specific surface area of the powder is preferably 2 to 20 m²/g and more preferably 4 to 10 m²/g. If the BET specific surface area is lower than 2 m²/g, densification of the sintered compact will proceed with greater difficulty, tending to result in low density and reduced strength of the sintered compact. If the BET specific surface area is higher than 20 m²/g, on the other hand, the powder will tend to aggregate, thereby hampering molding. In addition, the high sinterability tends to promote grain growth during firing, resulting in coarse particles and reduced strength of the sintered compact.

The mean secondary particle size of the powder is preferably no greater than 1.5 μm and more preferably 0.1 to 1.5 μm, in consideration of the powder moldability and sinterability. Using such a powder can improve the sintered compact density. Here, the "secondary particle size" is the particle size for aggregated primary particles as observed by TEM or the like. The secondary particle size can be measured with a wet particle size distribution meter or the like, after suspension of the powder.

The bulk density of the powder is preferably 0.5 to 1.8 g/cm³. Powder with a bulk density within this range will have excellent handleability and high molding yield. In addition, it can increase the density of the obtained zinc oxide sintered compact. The angle of repose of the powder is preferably no greater than 45°. A greater value will tend to impair the flow property of the powder, making it difficult to achieve uniform packing of the powder. The angle of repose of the powder is more preferably no greater than 35°, from the viewpoint of further improving the powder flow property.

[Molding Step]

The method for producing the compact is not particularly restricted, and for example, a die press molding method, cold isostatic press molding method or cast molding method may be used. The powder or slurry used as starting material may contain an organic or inorganic binder. Such methods may be used to fabricate compacts of various shapes, such as flat or cylindrical.

[Firing Step]

The obtained compact is formed into a sintered compact by firing at high temperature. The production apparatus used to produce the sintered compact is not particularly restricted, and for example, an electric furnace, gas furnace or hot press may be used. Preferred among these is an electric furnace, in terms of productivity, temperature distribution in the furnace and relative low cost of the apparatus.

According to this embodiment, zirconium is mixed with zinc oxide at 10 ppm or greater to obtain a dense sintered compact with a relative density of 95% or greater. The reason for this is as follows. Specifically, zirconium inhibits firing of zinc oxide during the firing. As a result, since the shrinkage speed during firing is reduced, the particle size of the sintered compact particles is smaller than when no zirconium is present. In addition, the differential shrinkage between the exterior and interior by firing is reduced, leaving fewer air bubbles inside the sintered compact. This yields a high-density sintered compact. Furthermore, addition of zirconium increases the strength of interaction at the grain boundaries, and can inhibit cracking, chipping and shedding at the grain boundaries.

The firing conditions are not particularly restricted, but from the viewpoint of shortening the firing time and preventing cracking, the temperature-elevating rate is preferably 10° C. to 400° C./hr. From the same viewpoint, the firing temperature is preferably 900° C. to 1200° C. In addition, from the viewpoint of obtaining a dense sintered compact with a relative density of 97% or greater, the firing temperature is preferably 950° C. to 1150° C. The temperature-lowering rate is preferably 10° C. to 400° C./hr from the viewpoint of preventing cracking. Especially in order to prevent cracking of the sintered compact by heat shock, the temperature when the sintered compact is removed from the furnace is preferably close to room temperature.

A higher density of the zinc oxide sintered compact can increase the strength. The relative density is therefore preferably 95% or greater and more preferably 97% or greater. A smaller particle size for the particles composing the zinc oxide sintered compact will increase the strength. Thus, the mean particle size of the particles of the zinc oxide sintered compact is preferably 1-15 μm and more preferably 1-10 μm.

The hardness of the sintered compact is preferably 120HV10 or greater and more preferably 150HV10 or greater, in terms of Vickers hardness. Such a sintered compact will exhibit increased strength. In order to prevent cracking of the target during sputtering, the target must have higher strength than the thermal stress generated in the target during sputtering. The thermal stress will differ depending on the sputtering conditions and sputter apparatus, but will generally be about 40 Mpa. Therefore, in order to prevent cracking of the target during sputtering, the target must have a strength, i.e. transverse intensity, that is greater than this level.

By using the zinc oxide sintered compact 10 of this embodiment as the target, it is possible to obtain a target transverse intensity of 40 MPa or greater. This can adequately inhibit cracking and chipping of the sintered compact during firing and sintered compact machining, and will allow increased yield to be obtained. It will also make it possible to minimize defects (pinholes) in the substrate that are caused by anomalous discharge resulting from cracking of the target during sputtering. This will allow stable film formation, so that a zinc oxide thin-film can be produced at high yield.

In the zinc oxide sintered compact 10 of this embodiment, zirconium generates carrier electrons, lowering the resistivity of the sintered compact. Thus, firing at high temperature results in a resistivity of $10^5$ Ω·cm or lower. The target can therefore be suitably used as a target for a direct current sputtering method. For stable direct current sputtering, however, the resistivity of the zinc oxide sintered compact 10 is preferably lowered still further.

In order to obtain a zinc oxide sintered compact 10 with an even lower resistivity, an inert gas or nitrogen gas is introduced into the firing furnace to lower the oxygen partial pressure in the firing atmosphere, and the zinc oxide compact is fired in that state. The oxygen partial pressure in the firing atmosphere will depend on the amount of zinc oxide compact to be fired. If the gas flow rate of introduction is represented as A (L/min) and the charging mass of the compact to be fired is represented as B (kg), the ratio is defined as the gas flow rate parameter, according to the following formula.

$$\text{Gas flow rate parameter} = B/A$$

If the gas flow rate parameter is no greater than 2.0, resulting in a zirconium content of at least 10 ppm in the zinc oxide sintered compact 10, the resistivity of the sintered compact will be no greater than $10^5$ Ω·cm even if the firing temperature is 1100° C. or below.

The zinc oxide sintered compact 10 of this embodiment can be used as a sputtering target. The zinc oxide sintered compact 10 may be machined to prescribed dimensions. The machining method is not particularly restricted, and for example, a surface grinding method, rotary grinding method or cylindrical grinding method may be employed. Since the zinc oxide sintered compact 10 of this embodiment contains a prescribed amount of zirconium, the particle size of the sintered compact is small and the grain boundary strength is increased. At the same time, the sintered compact is densified and the hardness of the sintered compact is increased. Cracking and chipping therefore occur less frequently during polishing of the sintered compact to the prescribed target dimensions. As a result, the yield during production of sputtering targets is increased.

The zinc oxide sintered compact 10 of this embodiment, and the zinc oxide sintered compact 20 described below, may if necessary be anchored (bonded) to a flat or cylindrical support using a bonding agent such as a solder material. The material of the support is not particularly restricted so long as it has high thermal conductivity and strength capable of supporting the sintered compact. The material of the support is preferably a metal such as Cu (copper), SUS (stainless steel) or Ti (titanium), for high thermal conductivity and high strength, and more preferably Ti (titanium) because it has a coefficient of thermal expansion close to that of zinc oxide.

Figure 2:
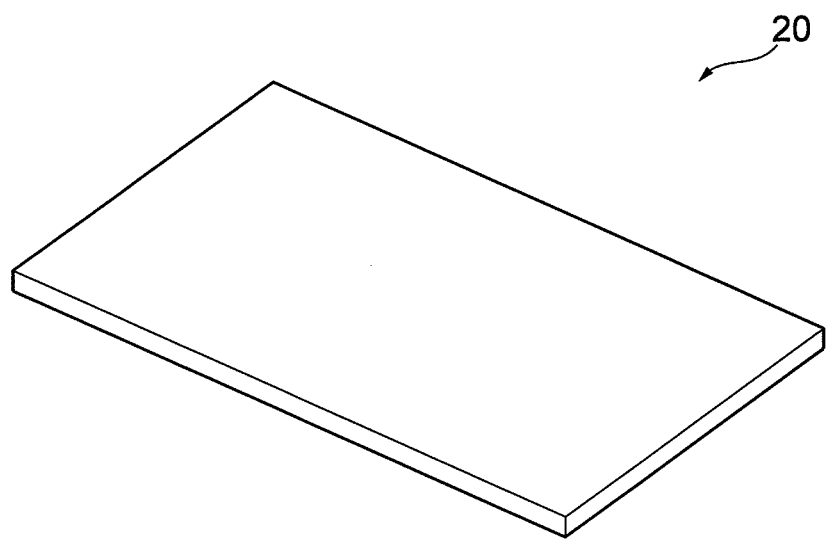
FIG. 2 is a perspective view showing another embodiment of a zinc oxide sintered compact of the invention.

FIG. 2 is a perspective view showing another embodiment of a zinc oxide sintered compact of the invention. The zinc oxide sintered compact 20 may have a flat shape, as shown in FIG. 2. The shape of the support is cylindrical when the zinc oxide sintered compact is cylindrical as shown in FIG. 1. When the zinc oxide sintered compact is flat as shown in FIG. 2, on the other hand, a flat support is used.

The adhesive material (bonding material) used to bond the sintered compact and the support is not particularly restricted so long as it has sufficient bonding strength for support, and for example, a conductive resin, tin-based solder material or indium-based solder material may be used. Of these, indium solder is preferred because it has high conductivity and thermal conductivity, and is soft and easily deformed. The reason for this is to allow efficient cooling of the heat on the target surface, and to allow absorption of the stress between the sintered compact and the support that is generated by thermal expansion to prevent cracking of the sintered compact.

If air bubbles (voids) remain in the adhesive material when the zinc oxide sintered compacts 10, 20 are bonded with the support with the adhesive material, the thermal conductivity will tend to be reduced at those sections. When air bubbles are present, it becomes impossible to efficiently cool the heat generated on the target surface during sputtering, and cracking of the target tends to occur. Air bubbles can be examined by X-ray photography or an ultrasonic inspection device. The bonding rate between the zinc oxide sintered compacts 10, 20 and the support may be defined by the following formula.

bonding rate=(area to be bonded−void area)/area to be bonded×100

During sputtering, the support undergoes little expansion because it is being cooled by cooling water. On the other hand, the sputtering target expands by the heat generated by sputtering, regardless of its shape. With a flat target such as shown in FIG. 2, therefore, the distance between the target and the support does not change. However, with a cylindrical target such as shown in FIG. 1, the distance between the target and the support increases due to thermal expansion of the target. Therefore, force is applied perpendicular to the interface between the sintered compact and the adhesive material, increasing detachment from the air bubble sections and lowering the heat conduction, with targets that have a low bonding rate. Consequently, a cylindrical target with a low bonding rate tends to result in more cracking than a flat target.

When a flat sintered compact 20 such as shown in FIG. 2 is used as the sputtering target, the bonding rate is preferably at least 90% from the viewpoint of preventing cracking. When a cylindrical zinc oxide sintered compact 10 such as shown in FIG. 1 is used as the target, however, the bonding rate is preferably at least 95% and more preferably at least 97%, from the same viewpoint.

The zinc oxide sintered compacts 10, 20 have higher strength than common high-purity zinc oxide sputtering targets. Stress between the sintered compact 10 and the support, generated by thermal expansion during bonding of the cylindrical sintered compact 10, can therefore be adequately withstood. It is thus possible to produce a sputtering target at high yield.

<Sputtering Target>

The sputtering target of this embodiment (also referred to simply as "target") comprises the aforementioned zinc oxide sintered compact, and the zinc oxide sintered compact may be used directly or machined for use in sputtering. Thus, the sputtering target of this embodiment may have either the cylindrical or flat shape shown in FIG. 1 or FIG. 2. The sputtering target of this embodiment also has the same composition as the zinc oxide sintered compact described above.

Because the sputtering target of this embodiment comprises the zinc oxide sintered compact described above, it has high density and high grain boundary strength. During sputtering, therefore, cracking of the target does not easily occur and particle generation is minimal. It is also possible to inhibit generation of black protrusion-like matter (nodules) that takes place on the target surface during sputtering. Furthermore, the high density results in high thermal conductivity, and also resistance to cracking by thermal stress even with application of high power to the target. Therefore, defects (pinholes) in the substrate can be reduced during production of a zinc oxide thin-film by sputtering. As a result, in addition to the high yield, the target can be used for prolonged periods.

<Zinc Oxide Thin-Film>

The zinc oxide thin-film of this embodiment (also referred to simply as "thin-film") is obtained using the sputtering target described above. The zinc oxide thin-film therefore has the same composition as the sputtering target (zinc oxide sintered compact). That is, by forming a film using a sputtering target made of a zinc oxide sintered compact containing zinc oxide as the major component and having a zirconium content of 10 to 1000 ppm, it is possible to obtain a zinc oxide thin-film having a zirconium content that is approximately equal to that of the sputtering target.

The zinc oxide thin-film of this embodiment has a zirconium content of 10 to 2000 ppm, and high resistivity of 10 $\Omega$·cm or greater.

There are no particular restrictions on the method for producing the zinc oxide thin-film of this embodiment, and examples include chemical vapor deposition methods such as CVD, methods of suspending or dissolving it in a solvent for coating, and methods of film formation by sputtering or the like. Sputtering is preferred among these methods. The sputtering target used for sputtering may be a zinc oxide sintered compact produced with a prescribed concentration of zirconium. A zinc oxide thin-film may also be formed by sputtering using a zinc oxide target with zirconium on-chip. Incidentally, a zinc oxide thin-film with a zirconium content of 10 to 1000 ppm can be obtained by sputtering the sputtering target described above.

Figure 5:
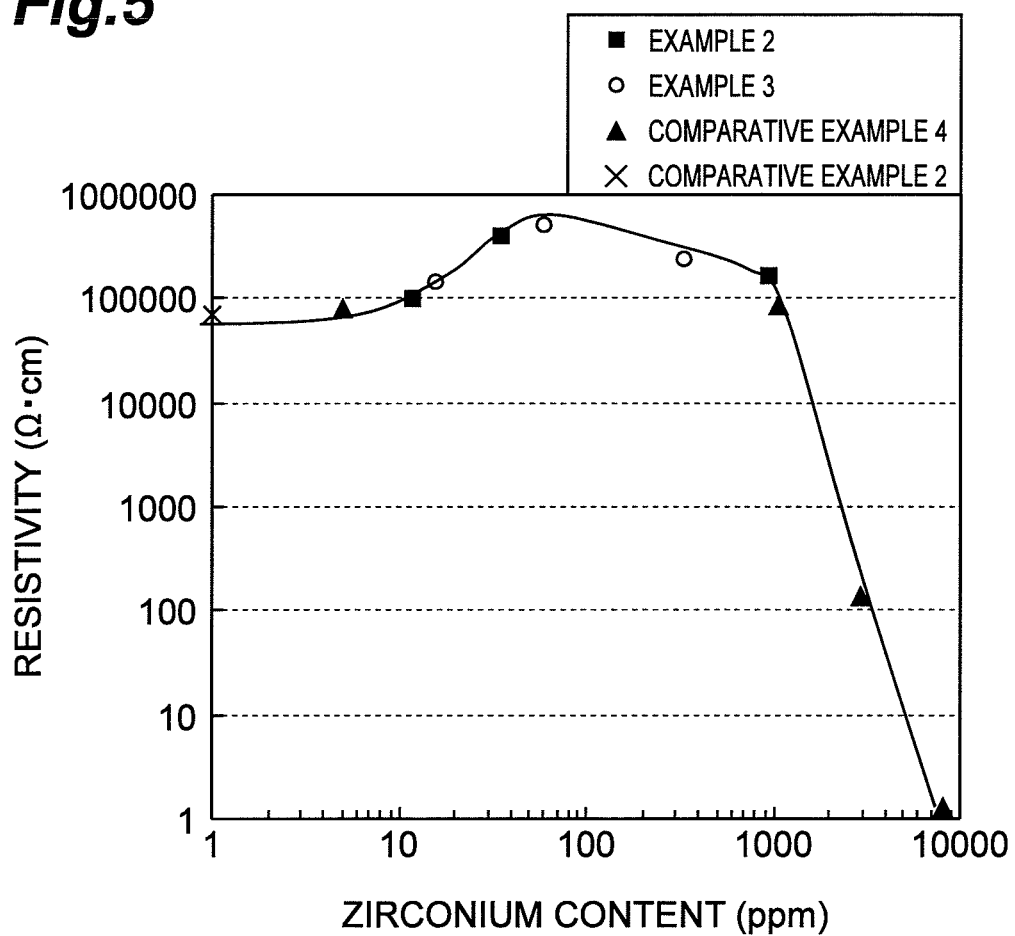
FIG. 5 is a graph showing the relationship between zirconium content and thin-film resistivity for zinc oxide thin-films of the examples and comparative examples.

As shown in FIG. 5 explained below, the zinc oxide thin-film of this embodiment has high resistivity, because it contains zirconium at 10 ppm or greater. High resistivity is also exhibited up to a zirconium concentration of about 1000 ppm. Exceeding approximately 1000 ppm, however, results in drastically reduced resistivity. Nevertheless, high resistivity of 10 $\Omega$·cm or greater, necessary for use as a highly resistant film layer for a solar cell such as a CIGS, is maintained until 2000 ppm is exceeded. The zinc oxide thin-film of this embodiment must therefore have its zirconium content limited to no greater than 2000 ppm. In order to obtain a zinc oxide thin-film with a sufficiently high resistance value, as shown in FIG. 5, the upper limit is 1000 ppm, as the region in which the resistance value begins to fall, and the zirconium content is between 10 and 1000 ppm.

It is not completely understood why the resistance value increases at about 10 ppm or greater and then falls at about 1000 ppm or greater, when the zirconium content is increased in this manner. It is considered likely that the locations where zirconium is present vary depending on the zirconium content, resulting in inhibition or increase in the conductivity of the thin-film, and that the threshold values for this variation are near 10 ppm and 1000 ppm.

The change in resistivity of a thin-film due to the sputtering conditions is not very significant up to a zirconium content of about 1000 ppm. However, a zirconium content of 1200 ppm or greater can potentially lower the resistivity of a thin-film in sputtering with argon gas alone. Therefore, by introducing a small amount of oxygen gas during sputtering, it is possible to inhibit carrier generation and increase the resistance value of the thin-film. Oxygen gas may also be introduced during sputtering even if the zirconium content is between 10 and 1000 ppm. The aforementioned effect is obtained if the amount of oxygen gas introduced is at least 0.2 vol % with respect to the amount of argon gas introduced. From the viewpoint of obtaining a thin-film with even higher resistance, the amount of oxygen gas introduced is preferably at least 0.4 vol %.

The zinc oxide thin-film of this embodiment has high transmittance since carrier generation is adequately inhibited by zirconium. With a film thickness of 100 nm, for example, very high transmittance, such as transmittance of 75% or greater, can be achieved not only at a wavelength of 500 nm but also across a wide range of 400 to 1200 nm. It is therefore suitable for use as a buffer layer or the like in a thin-film solar cell.

The embodiments described above are preferred embodiments of the invention, but the invention is not limited thereto. For example, the shape of the zinc oxide sintered compact is not limited to the shapes shown in FIG. 1 and FIG. 2, and may instead be another shape.

EXAMPLES

The invention will now be explained in greater detail with respect to examples and comparative examples, with the understanding that the invention is not limited to the examples. The physical properties of the powders, sintered compacts and thin-films used and fabricated in the examples and comparative examples were measured as follows.
(BET Specific Surface Area of Powder)
The BET specific surface area of the powder was measured by the single-point BET method, using a MONOSORB (trade name of Quantachrome, USA).
(Bulk Density of Powder)
The bulk density of the powder was measured according to the light bulk density measurement method specified in JIS R9301-2-3.
(Mean Secondary Particle Size of Powder)
the powder was suspended in water and subjected to ultrasonic dispersion for 2 minutes, and then a COULTER LS (trade name of Beckman Coulter, Inc.) was used to measure the particle size distribution. The median diameter was calculated from the measurement results and recorded as the mean secondary particle size.
(Measurement of Angle of Repose of Powder)
The angle of repose, as a parameter of the powder flow property, was measured using a Model PT-N Powder Tester by Hosokawa Micron Group.
(Mean Particle Size of Sintered Compact Particles)
After polishing the sintered compact, it is etched with acetic acid and the etching surface is observed using a SEM (scanning electron microscope) at 100-10,000× magnification, and the mean particle size of the particles is measured by the chord method.
(Vickers Hardness of Sintered Compact)
The Vickers hardness of the sintered compact was measured with an HV10, according to JIS R-1610.
(Transverse Intensity of Sintered Compact)
The transverse intensity of the sintered compact was measured according to JIS R-1601.
(Density of Sintered Compact)
The density of the sintered compact was measured by Archimedes' method. The relative density was calculated from the measured density and the true density of the sintered compact. The true density of the sintered compact was assumed to be 5.68 g/cm$^3$, as the density of zinc oxide.
(Zirconium Content of Powder, Sintered Compact and Thin-Film)
The zirconium content was measured by ICP analysis, after dissolution of each target of the measurement.
(Resistivity of Sintered Compact and Thin-Film)
A HIRESTA MCP-HT450 measuring apparatus (trade name of Mitsubishi Chemical Corp.) was used to detect the current value upon 1 minute application of a voltage of 10-1000 V, and the surface resistance was calculated. For samples that could not be measured with the HERESTA, a LORESTA HP MCP-T410 (trade name of Mitsubishi Chemical Corp.) was used and the four-point probe method was performed with application of a constant current of 1 mA to 100 mA.
(Transmittance of Thin-Film)
The light transmittance of the integrated body of the substrate and thin-film was measured using a U-4100 spectrophotometer (trade name of Hitachi, Ltd.), at a wavelength in the range of 240 nm to 2600 nm.

Example 1

Commercially available zinc oxide powder and zirconium oxide powder satisfying the JIS Class 1 standard were dry blended for 16 hours in a 10 L nylon pot, with a rotary ball mill using an iron-core containing resin ball with a 15 mm diameter. Thus, 2000 g of a mixed powder with a zirconium content of 45 ppm was obtained. Next, a 500 μm sieve was used for adjustment of the mixed powder size, to finally obtain approximately 1990 g of mixed powder. The physical properties of the size-adjusted powder are shown in Table 1.

A 600 g portion of the obtained powder was loaded into a 150 mmφ die and subjected to pressure molding at 300 kgf/cm$^2$ (29.42 MPa), to obtain a disc-shaped compact. A total of three compacts were produced in the same manner. The three compacts were subjected to CIP treatment at 3000 kgf/cm$^2$ (294.2 MPa).

Each compact was heated to 500° C. at 50° C./h, and then from 500° C. to 1100° C. at a temperature-elevating rate of 20° C./h. After holding at a firing temperature of 1100° C. for 3 hours, it was cooled at a temperature-lowering rate of 100° C./h. The firing was conducted in an air atmosphere. The firing conditions are shown in Table 2. The success rates up to firing and target fabrication are also shown in Table 2. Here, "success rate" means the proportion of sintered compacts and targets successfully fabricated without cracking or chipping.

The relative density, transverse intensity, Vickers hardness, mean particle size, resistivity and zirconium content of each obtained sintered compact are shown in Table 3. The values shown in Table 3 are the average values for the three sintered compacts. The three compacts were all successfully fired without cracking (success rate: 100%).

The three sintered compacts were then each worked into a disc shape with a diameter of 101.6 mmφ and a thickness of 5 mm. The disc-shaped sintered compacts were bonded to a copper backing plate to fabricate three zinc oxide targets (sputtering targets). The bonding material used was In (indium) solder.

One of the three obtained sputtering targets was used for film formation by RF sputtering under the following conditions, to form a zinc oxide thin-film. The obtained zinc oxide thin-film was evaluated. The evaluation results are shown in Table 4.

Discharge System: RF Sputtering
Film-forming apparatus: ULVAC CS2000 (trade name, magnetron sputtering apparatus)
Film-forming pressure: 0.4 Pa
Added gas: Argon gas+oxygen gas
Oxygen concentration: 0.4 vol %
Distance between target and substrate: 90 mm
Discharge power: 450 W
Zinc oxide thin-film thickness: Approximately 100 nm
Substrate temperature: Room temperature (approximately 25° C.)

The resistivity of the zinc oxide thin-film obtained by sputtering was a high value of $5.5 \times 10^6$ Ω·cm. The transmittance of the zinc oxide thin-film was 86% at a wavelength of 500 nm of transmitted light through a 100 nm film thickness. The zirconium content of the zinc oxide thin-film was 40 ppm zirconium, as shown in Table 4. This confirmed that using a high-strength zinc oxide-based sputtering target can produce a zinc oxide-based high-resistance thin-film.

Example 2

A compact was produced in the same manner Example 1, except that the mixing ratio of the zinc oxide powder and zirconium oxide powder was changed, for zirconium contents of 20 ppm, 45 ppm and 1000 ppm. Three samples each of the three compacts with different zirconium contents (Nos. 2, 3 and 4 in Table 1) were produced. The physical properties of the size-adjusted mixed powder are shown in Table 1.

Each compact was heated to 500° C. at 50° C./h, and then from 500° C. to 1100° C. at a temperature-elevating rate of 20° C./h, and held at a firing temperature of 1100° C. for 3 hours. The temperature was then lowered at a temperature-lowering rate of 100° C./h to obtain a zinc oxide sintered compact. The firing was conducted in a nitrogen gas atmosphere, under conditions with a gas flow parameter of 1.8. The firing conditions are shown in Table 2. The success rate up to firing was 100% for all of sample Nos. 2 to 4, as seen in Table 2. The physical properties of the sintered compacts were as shown in Table 3. It was thus confirmed that sintered compacts with high relative density, high transverse intensity, high Vickers hardness and low resistivity had been obtained.

Next, bonding was performed in the same manner as Example 1, to obtain zinc oxide targets. As shown in Table 2, the success rate up to target fabrication was 100%.

The obtained zinc oxide targets were used for film formation under the following conditions, and the obtained zinc oxide thin-films were evaluated.
Discharge system: Direct current sputtering method
Film-forming apparatus: ULVAC CS2000 (trade name, magnetron sputtering apparatus)
Film-forming pressure: 0.4 Pa
Added gas: Argon gas+oxygen gas
Oxygen concentration: 0.8%
Distance between target and substrate: 90 mm
Discharge power: 300 W
Zinc oxide thin-film thickness: Approximately 100 nm
Substrate temperature: Room temperature (approximately 25° C.)

The physical properties of the zinc oxide thin-films obtained by sputtering were as shown in Table 4. As shown in Table 4, zinc oxide thin-films with high resistance value and high transmittance were obtained. These results confirmed that a sputtering target with both high strength and low resistivity, containing zirconium at 18 to 990 ppm, can be fabricated at high yield. Specifically, it was confirmed that a zinc oxide-based thin-film with higher resistivity can be produced by a direct current sputtering method.

Example 3

A commercially available zinc oxide powder (15 kg) satisfying the JIS Class 1 standard was mixed with purified water to prepare a slurry. The slurry with a zinc oxide powder concentration of 50 wt % was dispersed using a wet bead mill apparatus. The apparatus container was made of zirconia, and the beads used were 0.3 mm zirconia beads.

The slurry treated with the wet bead mill apparatus was collected and subjected to spraying granulation. Since the amount of zirconium addition can be increased by lengthening the grinding time in the wet bead mill apparatus, three powders with different zirconium contents were prepared by varying the grinding time. The zirconium contents of the prepared powders were 15 ppm, 33 ppm and 120 ppm, respectively. The physical properties of each powder were as shown in Table 1, and the obtained powders had high flow properties.

A 600 g portion of each obtained powder was loaded into a 150 mmφ diameter die and subjected to pressure molding at 300 kgf/cm² (29.42 MPa). Three compacts each were produced from mixed powders with different zirconium contents (Nos. 5, 6 and 7 in Table 1). After pressure molding, CIP treatment was carried out at 3000 kgf/cm² (294.2 MPa) to increase the compact density.

Each compact was heated to 500° C. at 50° C./h, and then from 500° C. to 1100° C. at a temperature-elevating rate of 10° C./h, and held at a firing temperature of 1100° C. for 3 hours. It was then cooled at a temperature-lowering rate of 100° C./h to obtain a zinc oxide sintered compact. The firing was conducted in a nitrogen gas atmosphere, under conditions with a gas flow parameter of 1.0. The firing conditions are shown in Table 2. The success rate up to firing was 100% under each of the conditions, as seen in Table 2. The physical properties of the sintered compacts were as shown in Table 3, and it was confirmed that sintered compacts with high relative density, high transverse intensity, high Vickers hardness and high resistivity could be obtained at high yield.

Next, each of the obtained zinc oxide sintered compacts was used for bonding in the same manner as Example 1, to obtain a zinc oxide target. As shown in Table 2, the success rate up to firing was 100%.

Each of the obtained zinc oxide targets was used for film formation under the same conditions as Example 2 to form a zinc oxide thin-film, which was evaluated. The resistivity and transmittance of each zinc oxide thin-film obtained by sputtering were as shown in Table 4, and it was possible to produce high resistance zinc oxide thin-films with high transmittance.

Example 4

The same powder was prepared as the powder prepared for No. 6 in Example 3. The powder was packed into a cylindrical rubber die and subjected to CIP molding at 2000 kgf/cm² (196.133 MPa). Next, CIP treatment was carried out at 3000 kgf/cm² (294.2 MPa) to increase the density. Two cylindrical compacts were thus produced. No cracking had occurred in these compacts.

The obtained compacts were heated to 500° C. at 50° C./h, and then from 500° C. to 1100° C. at a temperature-elevating rate of 10° C./h, and held at a firing temperature of 1100° C. for 3 hours. It was then cooled at a temperature-lowering rate of 100° C./h to obtain a zinc oxide sintered compact. The firing was conducted in a nitrogen gas atmosphere, under conditions with a gas flow parameter of 1.0. The relative density of each sintered compact was 98.0%. The Vickers hardness was 175HV10. The sintered compact resistivity was 8.2×10³ Ω·cm. The zirconium content in the sintered compacts was 33 ppm. The mean particle size of the sintered compact particles was 7.0 μm.

Both compacts were successfully fired without cracking. Thus, cylindrical sintered compacts with higher relative density, higher transverse intensity, higher Vickers hardness and lower resistivity could be produced at high yield.

Next, each sintered compact was machined into a cylindrical shape with an inner diameter of 77.5 mmφ, an outer diameter of 91.5 mmφ and a thickness of 350 mm, and bonded onto a titanium backing tube to obtain a cylindrical zinc oxide target without cracking or chipping. The bonding material used was In solder.

The obtained targets were used for film formation under the following conditions, to form zinc oxide thin-films. The obtained zinc oxide thin-films were evaluated. The evaluation results were as shown in Table 4.
Discharge System: Direct Current Sputtering Method
Film-forming apparatus: Cylindrical cathode system
Film-forming pressure: 0.25 Pa
Added gas: Argon gas+oxygen gas
Oxygen concentration: 10 vol %
Distance between target and substrate: 90 mm
Discharge power: 500 W
Zinc oxide thin-film thickness: Approximately 100 nm
Substrate temperature: Room temperature The resistance of each zinc oxide thin-film obtained by sputtering was a high value of 5.0×10⁵ Ω·cm. The transmittance was 86% at a wavelength of 500 nm through a 100 nm film thickness. These results confirmed that it is possible to fabricate a cylindrical sputtering target to be used for production of a high-resistance zinc oxide thin-film, which has been difficult in the past.

Example 5

Powder containing zirconium was prepared in the same manner as Example 3, and a compact was produced in the same manner as Example 3. Three compacts each were produced with three different compositions (Nos. 9, 10 and 11 in Table 1), in the same manner as Example 3.

All of the produced compacts were heated to 500° C. at 50° C./h, and then from 500° C. to the firing temperature at a temperature-elevating rate of 10° C./h, and held at firing temperatures of 950° C., 1000° C., 1100° C. and 1170° C. for 3 hours each. They were then cooled at a temperature-lowering rate of 100° C./h to produce zinc oxide sintered compacts. The firing was conducted in a nitrogen gas atmosphere, under conditions with a gas flow parameter of 1.0. The firing conditions are shown in Table 2. As shown in Table 2, all three compacts for each sample No. could be fired without cracking. The physical properties of the sintered compacts were as shown in Table 3. These results confirmed high relative density, high transverse intensity, high Vickers hardness and high resistivity.

Next, each of the obtained zinc oxide sintered compacts was used for bonding in the same manner as Example 1, to obtain a zinc oxide target. As shown in Table 2, the success rate up to firing was 100%.

The obtained zinc oxide targets were used for film formation under the same conditions as Example 2 to form zinc oxide thin-films, and the thin-films were evaluated. The evaluation results were as shown in Table 4. The resistivity of each zinc oxide thin-film obtained by sputtering was a high value of 3.0×10⁵ Ω·cm. The transmittance was a high value of 86% for a wavelength of 500 nm through a 100 nm film thickness. The zirconium content was 65 ppm.

Comparative Example 1

Powder was prepared by the same method as Example 1, except that no zirconium was added to the commercially available zinc oxide powder satisfying the JIS Class 1 standard. The physical properties of the powder were as shown in Table 1. A 600 g portion of the prepared powder was loaded into a 150 mmφ diameter die and subjected to pressure molding at 300 kgf/cm² (29.42 MPa), to produce three compacts for each of Nos. 12-15 in Table 1. After pressure molding, CIP treatment was carried out at 3000 kgf/cm² (294.2 MPa) to increase the compact density.

The compact was heated to 500° C. at 50° C./h, and then from 500° C. to the firing temperature at a temperature-elevating rate of 20° C./h, and held at a firing temperature of 950° C., 1000° C., 1100° C. or 1200° C. for 3 hours. It was then cooled at a temperature-lowering rate of 100° C./h to obtain a sintered compact. The firing was conducted in air. The firing conditions are shown in Table 2. Three compacts were fired at each firing temperature to produce zinc oxide sintered compacts, and as shown by the "Success rate up to firing" in Table 2, some cracking occurred during firing with sample Nos. 14 and 15. This is presumably due to reduced strength, as seen by the transverse intensities shown in Table 3.

Next, each obtained zinc oxide sintered compact was used for bonding in the same manner as Example 1, to obtain a zinc oxide target. Because cracking occurred during machining, the success rate up to zinc oxide target fabrication was reduced, as shown in Table 2.

Each of the obtained zinc oxide targets was used for RF sputtering film formation under the same conditions as Example 1 to form a zinc oxide thin-film, and the thin-film was evaluated. The evaluation results were as shown in Table 4. The resistivity of each zinc oxide thin-film obtained by sputtering was a value between 1.0×10⁵ and 1.2×10⁶ Ω·cm. The transmittance was 86% to 87% at a wavelength of 500 nm through a 100 nm film thickness.

Comparative Example 2

Powder was prepared by the same method as Comparative Example 1, and molding was performed to produce three compacts. Each compact was heated to 500° C. at 50° C./h, and then from 500° C. to 1170° C. at a temperature-elevating rate of 10° C./h, and held at a firing temperature of 1170° C. for 3 hours. It was then cooled at a temperature-lowering rate of 100° C./h to obtain a zinc oxide sintered compact. The firing conditions are shown in Table 2. The firing was conducted in a nitrogen gas atmosphere, under conditions with a gas flow parameter of 1.0.

Next, each of the obtained zinc oxide sintered compacts was used for bonding in the same manner as Example 1, to obtain a zinc oxide target. Because cracking occurred during machining, the success rate up to target fabrication was reduced, as shown in Table 2.

Each of the obtained zinc oxide targets was used for film formation under the same conditions as Example 2 to form a zinc oxide thin-film, which was evaluated. The evaluation results were as shown in Table 4. The resistivity of each zinc oxide thin-film obtained by sputtering was $1.2 \times 10^5$ Ω·cm. The transmittance was 86% at a wavelength of 500 nm through a 100 nm film thickness.

Comparative Example 3

Powder was prepared in the same manner as Comparative Example 1, except that the amount of powder prepared was 15 kg. The powder was packed into a cylindrical rubber die and subjected to CIP molding at 2000 kgf/cm² (196.133 MPa), and then further CIP treatment at 3000 kgf/cm² (294.2 MPa) to increase the density, producing two cylindrical compacts.

Each produced compact was heated to 500° C. at 50° C./h, and then from 500° C. to 1170° C. at a temperature-elevating rate of 10° C./h, and held at a firing temperature of 1170° C. for 3 hours. It was then cooled at a temperature-lowering rate of 100° C./h to obtain a zinc oxide sintered compact. The firing was conducted in a nitrogen gas atmosphere, under conditions with a gas flow parameter of 1.0. The firing conditions are shown in Table 2. The evaluation results for the zinc oxide sintered compacts are shown in Table 3, and they were a relative density of 96.3%, a Vickers hardness of 110HV10 and a resistivity of $8.0 \times 10^4$ Ω·cm.

Each obtained sintered compact was machined into a cylindrical shape with an inner diameter of 77.5 mmφ, an outer diameter of 91.5 mmφ and a thickness of 350 mm, and bonding was attempted, but cracking occurred during the machining and bonding and it was not possible to fabricate a target.

Comparative Example 4

Compacts were produced in the same manner Example 1, except that the mixing ratio of the zinc oxide powder and zirconium oxide powder was changed as shown in Table 1, for a zirconium content in the mixed powder of 5 ppm, 1100 ppm, 3000 ppm or 8000 ppm. Three compacts were produced for each of the four compacts indicated as Nos. 18 to 21 in Table 1. The physical properties of each powder were as shown in Table 1.

Each compact was heated to 500° C. at 50° C./h, and then from 500° C. to 1100° C. at a temperature-elevating rate of 20° C./h, and held at a firing temperature of 1100° C. for 3 hours. It was then cooled at a temperature-lowering rate of 100° C./h to obtain a zinc oxide sintered compact. The firing was conducted in a nitrogen gas atmosphere, under conditions with a gas flow parameter of 1.0. The firing conditions are shown in Table 2.

The success rates up to firing were as shown in Table 2. The physical properties of the sintered compacts were as shown in Table 3. With a low zirconium content, the zinc oxide sintered compact strength was low and cracking occurred during firing.

Next, each of the obtained zinc oxide sintered compacts was used for bonding in the same manner as Example 1, to obtain a zinc oxide target. The obtained zinc oxide targets were used for film formation under the same conditions as Example 2 to form zinc oxide thin-films, and the thin-films were evaluated.

The physical properties of the zinc oxide thin-films obtained by sputtering were as shown in Table 4. With a high zirconium content, the resistivity was lowered and it was not possible to produce a zinc oxide film with a high resistance value.

TABLE 1

|  | No. | Zirconium content (ppm) | Bulk density (g/cm³) | Mean secondary particle size (μm) | Repose angle (°) | Specific surface area (m²/g) |
|---|---|---|---|---|---|---|
| Example 1 | 1 | 45 | 1.0 | 0.3 | 43 | 4.1 |
| Example 2 | 2 | 20 | 1.0 | 0.4 | 43 | 4.2 |
|  | 3 | 45 | 1.0 | 0.3 | 41 | 4.2 |
|  | 4 | 1000 | 1.1 | 0.4 | 44 | 4.1 |
| Example 3 | 5 | 20 | 1.3 | 0.1 | 32 | 5.4 |
|  | 6 | 33 | 1.5 | 0.1 | 31 | 6.5 |
|  | 7 | 120 | 1.7 | 0.1 | 32 | 8.5 |
| Example 4 | 8 | 33 | 1.5 | 0.1 | 31 | 6.5 |
| Example 5 | 9 | 33 | 1.5 | 0.1 | 31 | 6.5 |
|  | 10 | 33 | 1.5 | 0.1 | 31 | 6.5 |
|  | 11 | 33 | 1.5 | 0.1 | 31 | 6.5 |
| Comp. Ex. 1 | 12 | 0 | 1.0 | 0.4 | 41 | 4.1 |
|  | 13 | 0 | 1.0 | 0.4 | 41 | 4.1 |
|  | 14 | 0 | 1.0 | 0.4 | 41 | 4.1 |
|  | 15 | 0 | 1.0 | 0.4 | 41 | 4.1 |
| Comp. Ex. 2 | 16 | 0 | 1.0 | 0.3 | 42 | 4.1 |
| Comp. Ex. 3 | 17 | 0 | 1.0 | 0.4 | 41 | 4.1 |
| Comp. Ex. 4 | 18 | 5 | 1.0 | 0.4 | 43 | 4.1 |
|  | 19 | 1100 | 1.0 | 0.4 | 43 | 4.1 |
|  | 20 | 3000 | 1.0 | 0.3 | 43 | 4.3 |
|  | 21 | 8000 | 1.0 | 0.4 | 45 | 4.1 |

TABLE 2

|  | No. | Firing temperature (° C.) | Firing atmosphere | Gas flow parameter | Success rate up to firing (%) | Success rate up to target fabrication (%) |
|---|---|---|---|---|---|---|
| Example 1 | 1 | 1100 | Air | — | 100 | 100 |
| Example 2 | 2 | 1100 | Nitrogen | 1.8 | 100 | 100 |
|  | 3 | 1100 | Nitrogen | 1.8 | 100 | 100 |
|  | 4 | 1100 | Nitrogen | 1.8 | 100 | 100 |
| Example 3 | 5 | 1100 | Nitrogen | 1.0 | 100 | 100 |
|  | 6 | 1100 | Nitrogen | 1.0 | 100 | 100 |
|  | 7 | 1100 | Nitrogen | 1.0 | 100 | 100 |
| Example 4 | 8 | 1100 | Nitrogen | 1.0 | 100 | 100 |
| Example 5 | 9 | 900 | Nitrogen | 1.0 | 100 | 100 |
|  | 10 | 1000 | Nitrogen | 1.0 | 100 | 100 |
|  | 11 | 1170 | Nitrogen | 1.0 | 100 | 100 |

TABLE 2-continued

|  | No. | Firing temperature (° C.) | Firing atmosphere | Gas flow parameter | Success rate up to firing (%) | Success rate up to target fabrication (%) |
|---|---|---|---|---|---|---|
| Comp. Ex. 1 | 12 | 950 | Air | — | 100 | 66 |
|  | 13 | 1000 | Air | — | 100 | 66 |
|  | 14 | 1100 | Air | — | 66 | 33 |
|  | 15 | 1200 | Air | — | 66 | 33 |
| Comp. Ex. 2 | 16 | 1170 | Nitrogen | 1.0 | 100 | 66 |
| Comp. Ex. 3 | 17 | 1170 | Nitrogen | 1.0 | 50 | 0 |
| Comp. Ex. 4 | 18 | 1100 | Nitrogen | 1.0 | 66 | 66 |
|  | 19 | 1100 | Nitrogen | 1.0 | 100 | 100 |
|  | 20 | 1100 | Nitrogen | 1.0 | 100 | 100 |
|  | 21 | 1100 | Nitrogen | 1.0 | 100 | 100 |

TABLE 3

|  | No. | Transverse intensity (MPa) | Vickers hardness (HV10) | Resistivity ($\Omega \cdot cm$) | Mean size of particles ($\mu m$) | Relative density (%) | Zirconium content (ppm) |
|---|---|---|---|---|---|---|---|
| Example 1 | 1 | 110 | 170 | $2.0 \times 10^6$ | 7.2 | 97.8 | 45 |
| Example 2 | 2 | 62 | 140 | $7.8 \times 10^4$ | 8.0 | 98.0 | 18 |
|  | 3 | 122 | 170 | $3.8 \times 10^3$ | 7.2 | 98.1 | 45 |
|  | 4 | 160 | 190 | $3.2 \times 10^3$ | 6.8 | 98.0 | 990 |
| Example 3 | 5 | 65 | 175 | $5.3 \times 10^4$ | 8.2 | 98.0 | 15 |
|  | 6 | 130 | 185 | $8.2 \times 10^3$ | 7.0 | 98.2 | 33 |
|  | 7 | 150 | 200 | $3.4 \times 10^3$ | 6.7 | 98.5 | 120 |
| Example 4 | 8 | 130 | 175 | $8.2 \times 10^3$ | 7.0 | 98.0 | 33 |
| Example 5 | 9 | 180 | 220 | $2.3 \times 10^4$ | 3.5 | 98.1 | 33 |
|  | 10 | 160 | 190 | $6.5 \times 10^3$ | 6.5 | 98.6 | 33 |
|  | 11 | 50 | 120 | $4.2 \times 10^3$ | 15 | 97.6 | 33 |
| Comp. Ex. 1 | 12 | 120 | 207 | $5.8 \times 10^9$ | 5.2 | 99.1 | 1 |
|  | 13 | 80 | 147 | $1.0 \times 10^8$ | 7 | 98.4 | 1 |
|  | 14 | 35 | 115 | $5.1 \times 10^7$ | 9.3 | 98.3 | 1 |
|  | 15 | 24 | 110 | $3.2 \times 10^7$ | 17 | 96.5 | 1 |
| Comp. Ex. 2 | 16 | 25 | 115 | $3.2 \times 10^4$ | 16 | 96 | 1 |
| Comp. Ex. 3 | 17 | 20 | 110 | $8.0 \times 10^4$ | 16 | 96.3 | 1 |
| Comp. Ex. 4 | 18 | 22 | 110 | $6.0 \times 10^4$ | 16 | 96.8 | 5 |
|  | 19 | 165 | 190 | $8.5 \times 10^3$ | 6.8 | 98.0 | 1080 |
|  | 20 | 185 | 230 | $5.4 \times 10^2$ | 6.5 | 98.3 | 2800 |
|  | 21 | 212 | 250 | $2.5 \times 10^2$ | 3.7 | 97.5 | 8000 |

TABLE 4

|  | No. | Target shape | Sputter system | Resistivity $\Omega \cdot cm$ | Transmittance (%) (500 nm) | Zirconium content (ppm) |
|---|---|---|---|---|---|---|
| Example 1 | 1 | Flat | RF | $5.5 \times 10^6$ | 86 | 40 |
| Example 2 | 2 | Flat | DC | $1.0 \times 10^5$ | 87 | 12 |
|  | 3 | Flat | DC | $3.8 \times 10^5$ | 86 | 36 |
|  | 4 | Flat | DC | $1.6 \times 10^5$ | 86 | 950 |
| Example 3 | 5 | Flat | DC | $1.4 \times 10^5$ | 86 | 16 |
|  | 6 | Flat | DC | $4.9 \times 10^5$ | 87 | 60 |
|  | 7 | Flat | DC | $2.3 \times 10^5$ | 86 | 330 |
| Example 4 | 8 | Cylindrical | DC | $5.0 \times 10^5$ | 86 | 60 |
| Example 5 | 9 | Flat | DC | $3.0 \times 10^5$ | 86 | 65 |
|  | 10 | Flat | DC | $3.0 \times 10^5$ | 86 | 65 |
|  | 11 | Flat | DC | $3.0 \times 10^5$ | 86 | 65 |
| Comp. Ex. 1 | 12 | Flat | RF | $1.5 \times 10^6$ | 86 | 1 |
|  | 13 | Flat | RF | $2.5 \times 10^5$ | 87 | 1 |
|  | 14 | Flat | RF | $1.0 \times 10^5$ | 86 | 1 |
|  | 15 | Flat | RF | $1.2 \times 10^6$ | 86 | 1 |
| Comp. Ex. 2 | 16 | Flat | DC | $1.2 \times 10^5$ | 86 | 1 |
| Comp. Ex. 3 | 17 | Cylindrical | — | — | — | — |
| Comp. Ex. 4 | 18 | Flat | DC | $7.8 \times 10^4$ | 86 | 5 |
|  | 19 | Flat | DC | $8.5 \times 10^4$ | 87 | 1080 |
|  | 20 | Flat | DC | $1.4 \times 10^2$ | 87 | 2900 |
|  | 21 | Flat | DC | 1.3 | 85 | 8100 |

Figure 3:
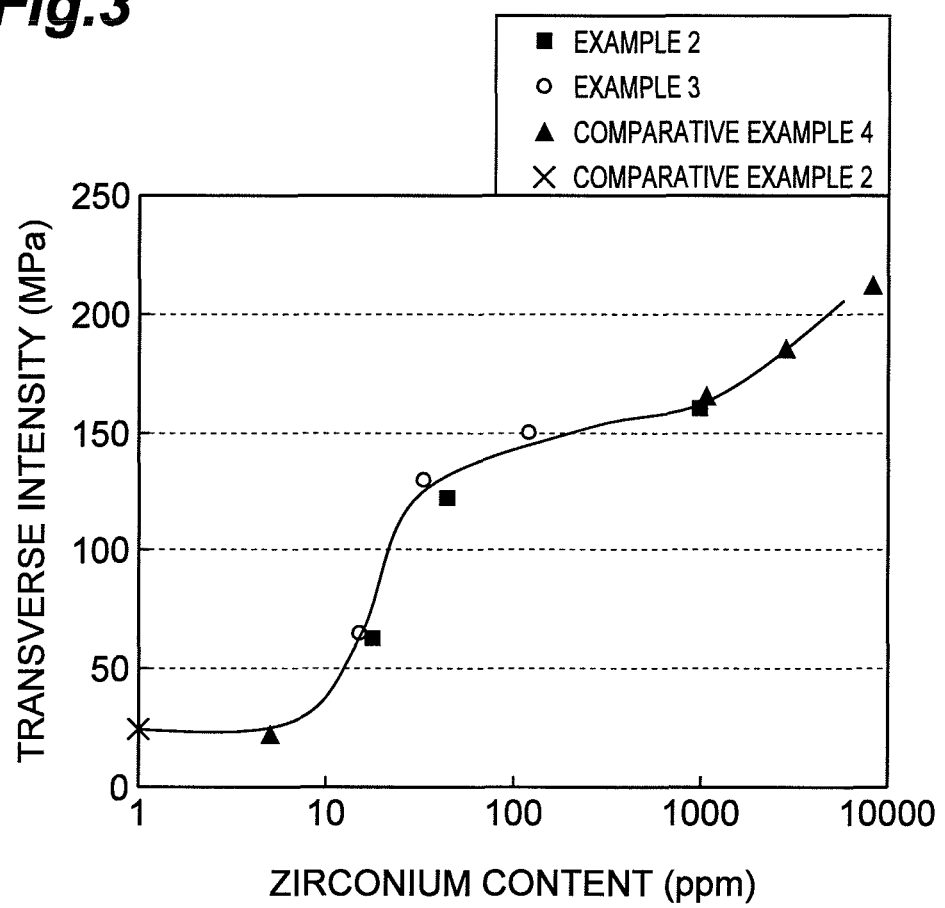
FIG. 3 is a graph showing the relationship between zirconium content and transverse intensity for zinc oxide sintered compacts of the examples and comparative examples.

FIG. 3 is a graph showing the relationship between the zirconium contents of the zinc oxide sintered compacts and the transverse intensities of the sintered compacts of Example 2, Example 3, Example 4 and Comparative Example 4, which were fired in a nitrogen gas atmosphere. The graph shows that a higher zirconium content results in increased sintered compact strength. Also, a low zirconium content (less than about 10 ppm) resulted in drastically reduced strength. It can be read from the graph that the sintered compact strength increases from around 10 ppm. In other words, with a zirconium content of 10 ppm or greater it is possible to obtain a zinc oxide sintered compact with increased strength.

Figure 4:
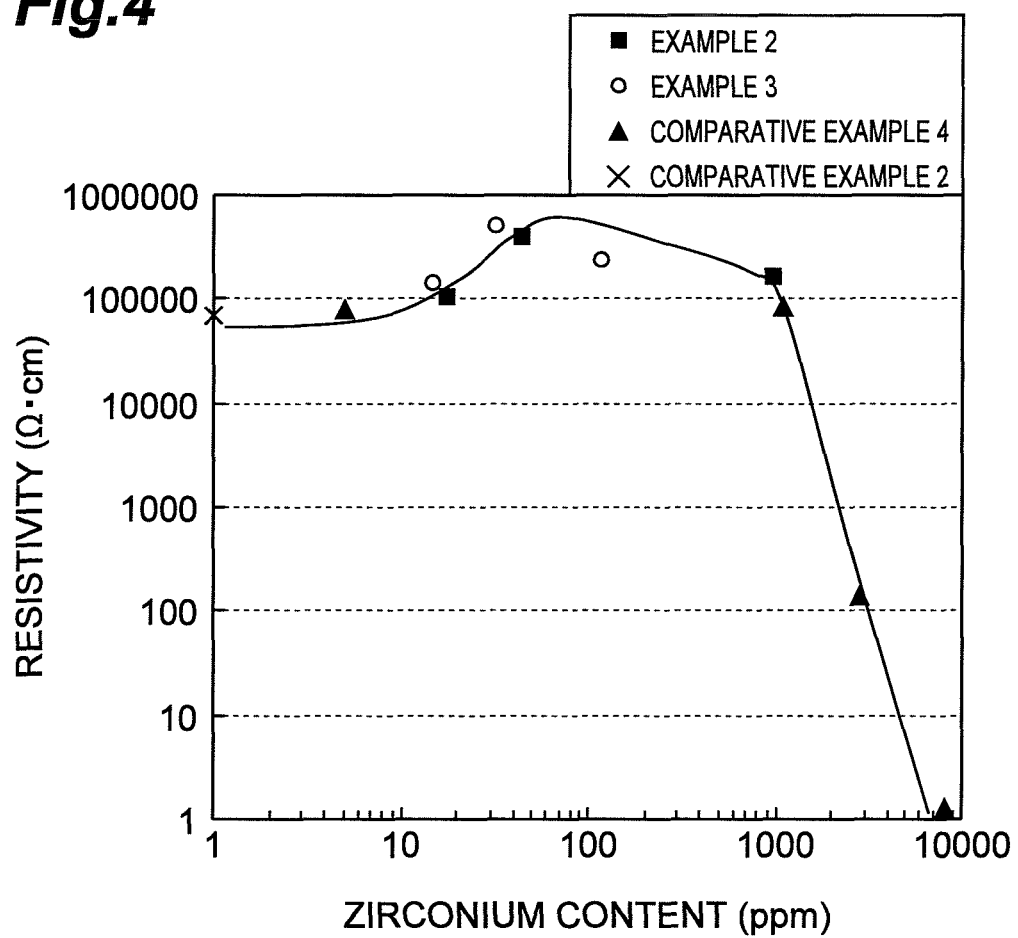
FIG. 4 is a graph showing the relationship between zirconium content and thin-film resistivity for zinc oxide sintered compacts of the examples and comparative examples.

FIG. 4 is a graph showing the relationship between zirconium contents in the zinc oxide sintered compacts and resistivities of the zinc oxide thin-films, for Example 2, Example 3, Comparative Example 2 and Comparative Example 4, wherein the films were formed by direct current sputtering. As seen from this graph, a zirconium content exceeding about 1000 ppm significantly lowers the thin-film resistivity. Thus, limiting the zirconium content to no greater than 1000 ppm can maintain high resistivity for zinc oxide thin-films.

FIG. 5 is a graph showing the relationship between zirconium contents in the zinc oxide thin-films and resistivities of the zinc oxide thin-films, for Example 2, Example 3, Comparative Example 2 and Comparative Example 4, wherein the films were formed by direct current sputtering. As seen from this graph, a zirconium content exceeding about 1000 ppm significantly lowers zinc oxide thin-film resistivity. Although high resistivity of at least 10 Ω·cm is exhibited up to at least 2000 ppm, the resistivity is drastically lowered when this is exceeded.

Figure 6:
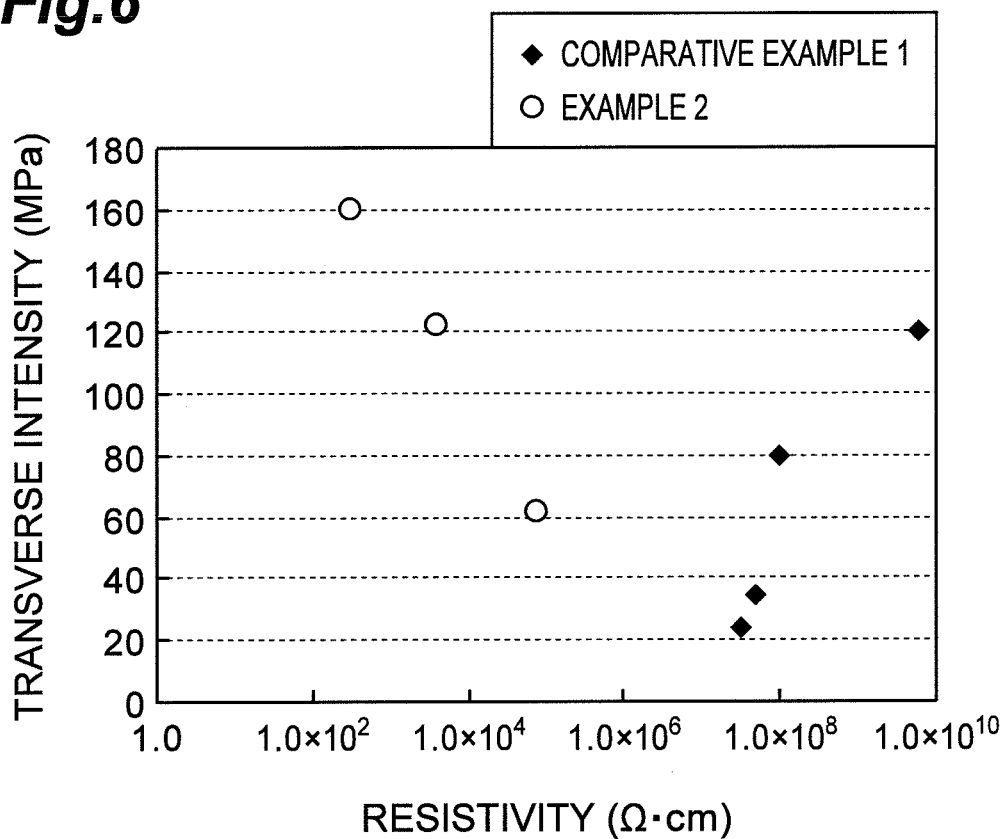
FIG. 6 is a graph showing the relationship between resistivity and transverse intensity for zinc oxide sintered compacts of the examples and comparative examples.

FIG. 6 is a graph showing the relationship between the resistivities and transverse intensities of the sintered compacts of Example 2 and Comparative Example 1. Example 2 contains zirconium, and Comparative Example 1 does not contain zirconium. As seen by Comparative Example 1, when no zirconium is present, lowering the resistivity of the sintered compact lowers the transverse intensity. In other words, it is not possible to increase the transverse intensity of a sintered compact while lowering the resistance. However, by adding a suitable amount of zirconium as in Example 2, it is possible to obtain both low resistance of no greater than $10^5$ Ω·cm and high transverse intensity of at least 40 MPa. In other words, adding a suitable amount of zirconium makes it possible to fabricate a sputtering target with higher transverse intensity and lower resistivity than a conventional thin-film sputtering target that has high resistivity.

Figure 7:
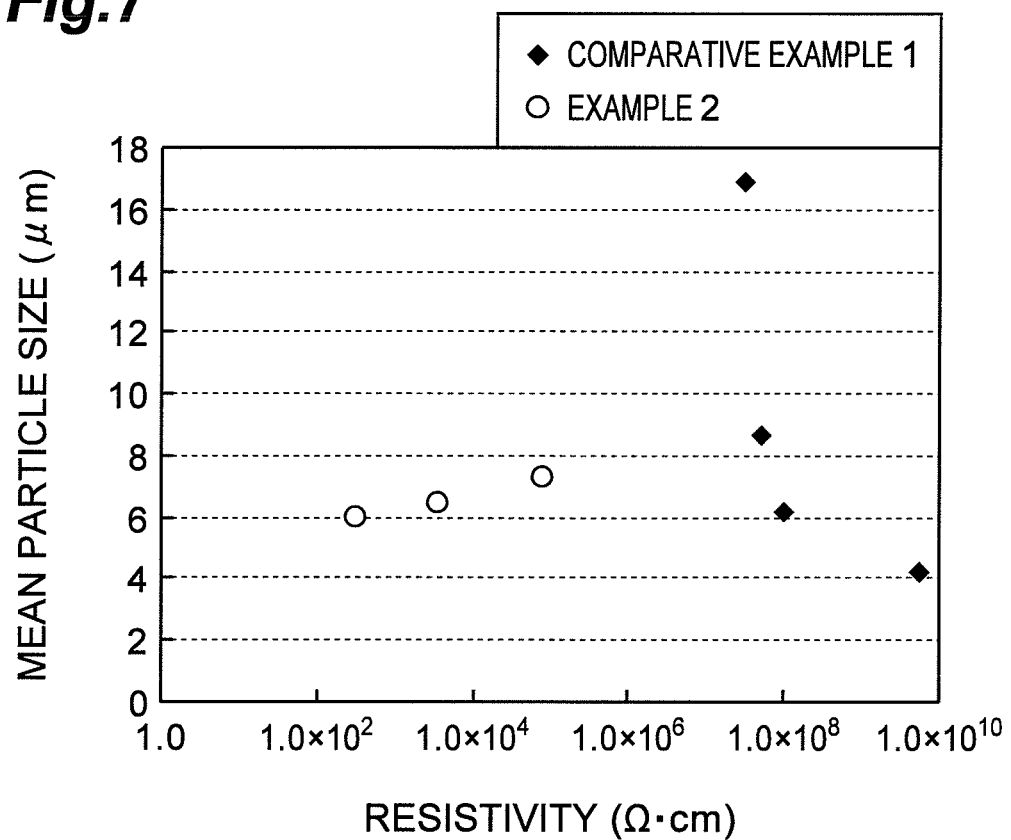
FIG. 7 is a graph showing the relationship between resistivity and particle size for zinc oxide sintered compacts of the examples and comparative examples.

FIG. 7 is a graph showing the relationship between the resistances of the sintered compacts of Example 2 and Comparative Example 1, and the mean particle sizes of the particles of the sintered compacts. A conventional sintered compact will have a larger mean particle size of particles of the sintered compact as the resistance value of the sintered compact decreases, as understood from Comparative Example 1. In contrast, as shown by Example 2, adding a suitable amount of zirconium can inhibit enlargement of the sintered compact particles even when the resistance value of the sintered compact is reduced. This relationship also contributes to the relationship shown in FIG. 6, and smaller sintered compact particles result in increased transverse intensity of a sintered compact. Adding zirconium, therefore, can inhibit growth of sintered compact particles, while zirconium imparts suitable conductivity, thereby reducing the resistivity of the sintered compact.

Figure 8:
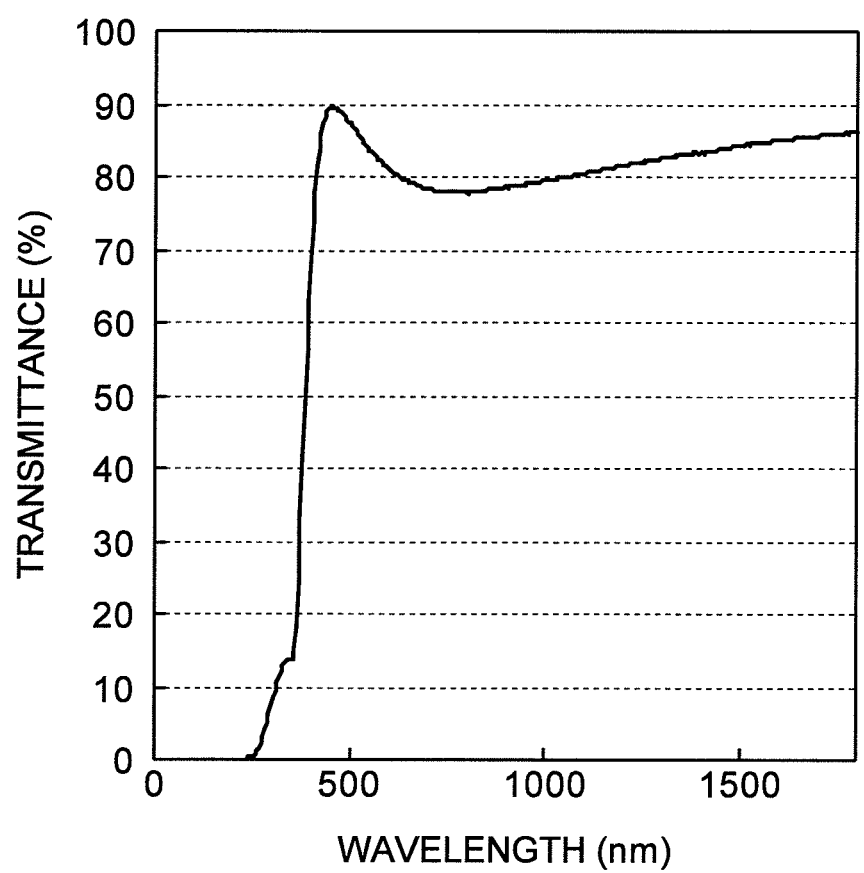
FIG. 8 is a graph showing the relationship between wavelength and transmittance for zinc oxide thin-films of the examples and comparative examples.

FIG. 8 is a graph showing the transmittance of zinc oxide thin-film No. 6 of Example 3. The light wavelength is shown on the abscissa, and the relevant transmittance is shown on the ordinate. It is seen that high transmittance was exhibited across a wide wavelength range.

INDUSTRIAL APPLICABILITY

According to the invention it is possible to prevent cracking and chipping from occurring while bonding during firing, sintered compact machining and target fabrication, and to improve productivity for sputtering targets. It is also possible to adequately inhibit cracking of targets during sputtering, and allow stable production of a zinc oxide thin-film with both high resistivity and high transmittance. There is also provided a zinc oxide thin-film with high resistivity, that can be suitably used in a semiconductor insulating film or a buffer layer for a solar cell.

EXPLANATION OF SYMBOLS

10, 20: Zinc oxide sintered compacts (sintered compacts)

The invention claimed is:
1. A sintered compact consisting of
zinc oxide;
10 to 1000 ppm zirconium; and
optionally, alumina.
2. The sintered compact according to claim 1, wherein the resistivity is no greater than $10^5$ Ω·cm.
3. A sputtering target comprising the sintered compact according to claim 2.
4. The sintered compact according to claim 1, which is cylindrical.
5. A sputtering target comprising the sintered compact according to claim 4.
6. A sputtering target comprising the sintered compact according to claim 1.
7. The sintered compact according to claim 1, having a relative density of 97% or greater.
8. A thin-film consisting of
zinc oxide;
10 to 2000 ppm zirconium; and
optionally, alumina;
wherein a resistivity of the thin-film is 10 Ω·cm or greater.
9. The thin-film according to claim 8, wherein the zirconium content is 10 to 1000 ppm.
10. The thin-film according to claim 9, wherein the transmittance at a wavelength of 500 nm is 75% or greater when a film thickness is 100 nm.
11. The thin-film according to claim 8, wherein the transmittance at a wavelength of 500 nm is 75% or greater when a film thickness is 100 nm.

* * * * *